United States Patent
Sasa

(10) Patent No.: US 7,244,773 B2
(45) Date of Patent: Jul. 17, 2007

(54) ACTINIC RAY CURABLE INK-JET INK AND PRINTED MATTER

(75) Inventor: Nobumasa Sasa, Sayama (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 0 days.

(21) Appl. No.: 11/289,689

(22) Filed: Nov. 30, 2005

(65) Prior Publication Data

US 2006/0142409 A1  Jun. 29, 2006

Related U.S. Application Data

(63) Continuation of application No. 10/865,912, filed on Jun. 14, 2004, now abandoned.

(30) Foreign Application Priority Data

Jun. 17, 2003  (JP) .............................. 2003-171897

(51) Int. Cl.
*C08F 2/46* (2006.01)
*B05D 3/06* (2006.01)
*B05D 1/26* (2006.01)

(52) U.S. Cl. .................. 522/168; 522/100; 522/167; 522/170; 522/909; 428/411.1; 428/413; 427/463; 427/469; 101/491

(58) Field of Classification Search ................ 522/100, 522/167, 168, 170, 909; 427/463, 469; 101/491; 428/411.1, 413
See application file for complete search history.

(56) References Cited

U.S. PATENT DOCUMENTS

| | | |
|---|---|---|
| 6,232,361 B1 | 5/2001 | Laksin et al. |
| 2004/0019128 A1 | 1/2004 | Kondo |
| 2005/0170187 A1 | 8/2005 | Ghoshal |

FOREIGN PATENT DOCUMENTS

| | | |
|---|---|---|
| JP | 2001-220526 | 8/2001 |
| JP | 2002-188035 | 7/2002 |

OTHER PUBLICATIONS

T. Okitsu, "The Okitsu Method," *Secchaku*, vol. 38(6) pp. 246-252 (1994).

*Primary Examiner*—Sanza L. McClendon
(74) *Attorney, Agent, or Firm*—Finnegan, Henderson, Farabow, Garrett & Dunner, L.L.P.

(57) ABSTRACT

Disclosed is an actinic ray curable ink-jet ink comprising a cationically polymerizable compound including a cationically polymerizable epoxy compound and a cationically polymerizable oxetane ring-containing compound, wherein the actinic ray curable ink-jet ink contains the cationically polymerizable epoxy compound in an amount of from 35 to 95% by weight based on the total amount of cationically polymerizable compound, the cationically polymerizable epoxy compound having a solubility parameter (sp value) of from 10 to 20, and the cationically polymerizable oxetane ring-containing compound having a solubility parameter (sp value) of from 5 to 8.0, and wherein the actinic ray curable ink-jet ink has a viscosity at 25° C. of 5 to 50 mPa·s.

10 Claims, No Drawings

ACTINIC RAY CURABLE INK-JET INK AND PRINTED MATTER

CROSS REFERENCE TO RELATED APPLICATIONS

This is a continuation of application Ser. No. 10/865,912, filed Jun. 14, 2004, now abandoned which claims the priority of Japanese Patent Application No. 2003-171897, filed Jun. 17, 2003, which is incorporated herein by reference.

FIELD OF THE INVENTION

The present invention relates to an actinic ray curable ink-jet ink and a printed material using the same.

BACKGROUND OF THE INVENTION

Up to now, as an ink-jet ink exhibiting good water resistance, there has been an ink which contains a water soluble dye dispersed or dissolved in a high boiling point solvent, and which contains a water soluble dye dissolved in a volatile solvent. However, a dye is inferior to a pigment in resistance characteristics such as light stability, and therefore ink using a pigment as a coloring agent has been required. But, it is difficult to disperse a pigment stably in an organic solvent, and it is also difficult to ensure stable dispersibility and ejectibility. On the other hand, in cases when ink using a high boiling solvent is applied onto a non-absorptive recording medium, a solvent in the ink is not volatized, results in difficulty of drying via evaporation of the solvent. Accordingly, ink using high boiling solvent cannot be printed on a non-absorptive recording medium.

Generally, ink using a volatile organic solvent can be properly printed onto a non-absorptive recording medium, due to adhesiveness of resin used and volatilization of the solvent. However, such ink, in which the volatile solvent is a major component, is easily dried at the nozzles of a recording head due to volatilization of the solvent, requiring frequent maintenance. Resistance of ink to some solvents may not be sufficient because the ink essentially requires good solubility in a solvent used.

Further, in an on-demand printer using a piezo element, usage of a large amount of a volatile solvent in ink increases frequency of maintenance, and also tends to cause problems of dissolution and swelling of members contacting the ink in the printer. In addition, a volatile solvent has numerous restrictions as a dangerous material under the Fire Defense Law. Consequently, in an on-demand printer using a piezo element, it is necessary to employ ink containing a volatile solvent in a small amount. However, components used in an actinic ray curable ink usually are ones having a relatively high viscosity. Therefore, it has been difficult to design ink having a viscosity capable of being ejected in conventional printers and further having good curability and high stability.

In order to overcome the problems described above, an actinic ray curable composition is disclosed (see for example, Japanese Patent O.P.I. Publication No. 2001-220526) which contains a cationic photopolymerization initiator, an epoxy compound, a compound having an oxetane ring with a hydroxyl group, and a vinyl ether. In the above document, the epoxy compound and the compound having an oxetane ring with a hydroxyl group both are cationically polymerizable compounds having a solubility parameter (sp value) exceeding 10, and the epoxy compound content of the composition is 47 to 63% by weight based on the total weight of cationically polymerizable compound. An extensive study of the above actinic ray curable composition has been studied, and, as a result, it has been proven that ink of this composition has problems in its curability, strength of a cured layer therefrom, ejection stability from nozzles, its adhesion to a substrate, solvent resistance, and water resistance.

Further, an actinic ray curable composition is disclosed (see for example, Japanese Patent O.P.I. Publication No. 2002-188035), which contains 10 to 50% by weight of a compound having an oxirane ring, 50 to 90% by weight of a compound having an oxetane ring and 0 to 40% by weight of a vinyl ether. In the patent above document, the compound having an oxirane ring (epoxy compound) is a cationically polymerizable compound having a solubility parameter (sp value) exceeding 10, the epoxy compound content of the composition is not more than 50% by weight based on the total weight of cationically polymerizable compound, and some of the compound having an oxetane ring have an sp value exceeding 8.0, and others have an sp value of not more than 8.0. An extensive study of the above actinic ray curable composition has been studied, and, as a result, it has been proven that ink of this composition containing particularly a compound having an oxetane ring and having an sp value exceeding 8.0 has problems in its curability, strength of a cured layer therefrom, ejection stability from nozzles, its adhesion to a substrate, solvent resistance, and water resistance.

SUMMARY OF THE INVENTION

An object of the invention is to provide an actinic ray curable ink-jet ink providing excellent photopolymerization properties, good curability, high strength of a cured ink layer, excellent ejection stability from nozzles, good adhesion to a substrate, good solvent resistance, and good water resistance, and to provide a printed matter prepared employing the actinic ray curable ink-jet ink.

DETAILED DESCRIPTION OF THE INVENTION

The above object of the present invention is achieved by the following:

1. An actinic ray curable ink-jet ink comprising a cationically polymerizable compound including a cationically polymerizable epoxy compound and a cationically polymerizable oxetane ring-containing compound, wherein the actinic ray curable ink-jet ink contains the cationically polymerizable epoxy compound in an amount of from 35 to 95% by weight based on the total amount of cationically polymerizable compound, the cationically polymerizable epoxy compound having a solubility parameter (sp value) of from 10 to 20, and the cationically polymerizable oxetane ring-containing compound having a solubility parameter (sp value) of from 5 to 8.0, and wherein the actinic ray curable ink-jet ink has a viscosity at 25° C. of 5 to 50 mPa·s.

2. The actinic ray curable ink-jet ink of item 1 above, wherein the actinic ray curable ink-jet ink contains the cationically polymerizable epoxy compound in an amount of from 50 to 95% by weight based on the total amount of cationically polymerizable compound.

3. The actinic ray curable ink-jet ink of item 1 above, wherein the actinic ray curable ink-jet ink contains the cationically polymerizable epoxy compound in an amount of from 65 to 95% by weight based on the total amount of cationically polymerizable compound.

4. The actinic ray curable ink-jet ink of item 1 above, wherein the epoxy compound is epoxidized vegetable oil.

5. The actinic ray curable ink-jet ink of item 1 above, further comprising a vinyl ether compound.

6. The actinic ray curable ink-jet ink of item 1 above, further comprising a cationic photopolymerization initiator as an initiator.

7. The actinic ray curable ink-jet ink of item 1 above, further comprising a radically polymerizable ethylenically unsaturated compound.

8. The actinic ray curable ink-jet ink of item 1 above, further comprising pigment as a colorant.

9. The actinic ray curable ink-jet ink of item 8 above, further comprising a pigment dispersant.

10. The actinic ray curable ink-jet ink of item 9 above, wherein the pigment has an average particle size of from 10 to 150 nm.

11. A printed matter, prepared by supplying the actinic ray curable ink-jet ink of item 1 above onto a recording medium.

1-1. An actinic ray curable ink-jet ink comprising a cationically polymerizable epoxy compound and a cationically polymerizable oxetane ring-containing compound, wherein the actinic ray curable ink-jet ink contains the cationically polymerizable epoxy compound in an amount of from 35 to 95% by weight based on the total amount of cationically polymerizable compound, the cationically polymerizable epoxy compound having a solubility parameter (sp value) of from 10 to 20, and the cationically polymerizable oxetane ring-containing compound having a solubility parameter (sp value) of from 5 to 8.0, and wherein the actinic ray curable ink-jet ink has a viscosity at 25° C. of 5 to 50 mPa·s.

1-2. The actinic ray curable ink-jet ink of item 1-1 above, wherein the actinic ray curable ink-jet ink contains the cationically polymerizable epoxy compound in an amount of from 50 to 95% by weight based on the total amount of cationically polymerizable compound.

1-3. The actinic ray curable ink-jet ink of item 1-1 above, wherein the actinic ray curable ink-jet ink contains the cationically polymerizable epoxy compound in an amount of from 65 to 95% by weight based on the total amount of cationically polymerizable compound.

1-4. The actinic ray curable ink-jet ink of any one of items 1-1 through 1-3 above, wherein the epoxy compound is epoxidized vegetable oil.

1-5. The actinic ray curable ink-jet ink of any one of items 1-1 through 1-4 above, further comprising a vinyl ether compound.

1-6. The actinic ray curable ink-jet ink of any one of items 1-1 through 1-5 above, further comprising a cationic photopolymerization initiator as an initiator.

1-7. The actinic ray curable ink-jet ink of any one of items 1-1 through 1-6 above, further comprising a radically polymerizable ethylenically unsaturated compound.

1-8. The actinic ray curable ink-jet ink of any one of items 1-1 through 1-7 above, further comprising pigment as a colorant.

1-9. The actinic ray curable ink-jet ink of item 1-8 above, further comprising a pigment dispersant.

1-10. The actinic ray curable ink-jet ink of item 1-8 or 1-9 above, wherein the pigment has an average particle size of from 10 to 150 nm.

1-11. A printed matter, prepared by supplying the actinic ray curable ink-jet ink of any one of items 1-1 through 1-10 above onto a recording medium.

Next, the present invention will be explained in detail.

As a pigment contained in the actinic ray curable ink-jet ink of the invention (hereinafter also referred to as simply the ink-jet ink of the invention) usable are inorganic achromatic pigments such as carbon black, titanium oxide and potassium carbonate or organic chromatic pigments. Examples of the organic pigments include insoluble azo pigments such as Toluidine Red, Toluidine Maroon, Hanza Yellow, Benzidine Yellow, and Pyrazolone Red; soluble azo pigments such as Lithol Red, Helio Bordeaux, Pigment Scarlet, and Permanent Red 2B; derivatives derived from vat dyes such as Alizarine, indanthrone, and Thioindigo maroon; phthalocyanine organic pigments such as Phthalocyanine Blue and Phthalocyanine Green; quinacridone organic pigments such as Quinacridone Red and Quinacridone Magenta; perylene organic pigments such as Perylene Red and Perylene Scarlet; isoindolinone organic pigments such as Isoindolinone Yellow and Isoindolinone Orange; pyranthrone organic pigments such as Pyranthrone Red and Pyranthrone Orange; thioindigo organic pigments; condensed azo organic pigments; benzimidazolone organic pigments; quinophtharone organic pigments such as Quinophthalone Yellow; isoindolin organic pigments such as Isoindolin Yellow; and other pigments such as flavanthrone yellow, acylamide yellow, nickel azo yellow, copper azomethine yellow, perynone orange, anthrone orange, dianthraquinonyl red, and dioxazine violet.

Examples of the organic pigments, represented by the Color Index (C.I.) number, include C.I. Pigment Yellow 12, 13, 14, 17, 20, 24, 74, 83, 86, 93, 109, 110, 117, 125, 128, 129, 137, 138, 139, 147, 148, 150, 151, 153, 154, 155, 166, 168, 180, and 185; C.I. Pigment Orange 16, 36, 43, 51, 55, 59, and 61; C.I. Pigment Red 9, 48, 49, 52, 53, 57, 97, 122, 123, 149, 168, 177, 180, 192, 202, 206, 215, 216, 217, 220, 223, 224, 226, 227, 228, 238, and 240; C.I. Pigment Violet 19, 23, 29, 30, 37, 40, and 50; C.I. Pigment Blue 15, 15:1, 15:3, 15:4, 15:6, 22, 60, and 64; C.I. Pigment Green 7 and 36; and C.I. Pigment Brown 23, 25, and 26.

Of the foregoing pigments, quinacridone organic pigments, phthalocyanine organic pigments, benzimidazolone organic pigments, isoindolinone organic pigments, condensed azo organic pigments, quinophthalone organic pigments, and isoindolin organic pigments are preferred in view of light fastness. The organic pigments are preferably pigment particles having an average particle diameter of from 10 to 150 nm, which is determined utilizing a laser scattering method. Pigments having an average particle diameter less than 10 nm lowers the light fastness due to the excessively small particle diameter. On the other hand, pigments having an average diameter exceeding 150 nm lowers dispersion stability in the dispersion solution, whereby the pigments tend to precipitate.

Minute-sized organic pigments can be prepared, employing the method described below. Namely, a clayey mixture, comprising at least three components of an organic pigment, a water-soluble inorganic salt in a factor of at least 3 by weight of the organic pigment, and a water miscible solvent, is sufficiently kneaded to result in minute particles, employing a kneader and the like. Thereafter, the resulting mixture is poured in water and stirred employing a high speed mixer to prepare a slurry. The resulting slurry is repeatedly filtered and washed with water, whereby the water soluble salt and the water miscible solvent are removed. During preparation of the minute-sized organic pigments, resins and pigment dispersing agents can be added. Listed as the water soluble inorganic salt are sodium chloride and potassium chloride. The inorganic salt is used in an amount 3 or more times the weight of the organic pigment used, and preferably in an amount 20 or less times the weight of the organic pigment used. When the weight of the inorganic salt is less than 3 times the organic pigment, it is impossible to prepare pigment particles of the desired particle size. On the other hand, when the weight of the inorganic salt is more than 20 times the organic pigment, excessively high load is imposed on the washing process as a post-process, resulting in substantial reduction of the processed amount of the organic pigments.

Use of the water miscible solvent provides a mixture in a clayey state, which contains pigment and a water soluble inorganic salt used as a crushing aid, and eases efficient crushing. The water miscible solvent is not specifically limited as long as it is miscible in water. However, temperature of the mixture elevates during kneading, and the solvent in the mixture tends to vaporize. Therefore, from the viewpoint of safety, a high boiling point solvent having a boiling point of from 120 to 250° C. is preferably used. Examples of the water miscible solvent include 2-(methoxymethoxy) ethanol, 2-butoxyethanol, 2-(isopentyloxy)ethanol, 2-(hexyloxy)ethanol, diethylene glycol, diethylene glycol monomethyl ether, diethylene glycol monoethyl ether, diethylene glycol monobutyl ether, triethylene glycol, triethylene glycol monomethyl ether, liquid polyethylene glycol, 1-methoxy-2-propanol, 1-ethoxy-2-propanol, dipropylene glycol, dipropylene glycol monomethyl ether, dipropylene glycol monoethyl ether, and a low molecular weight polypropylene glycol.

In the present invention, the pigment is incorporated in the ink-jet ink in an amount of preferably from 3 to 15% by weight, in order to obtain a high image density and sufficient light fastness.

The cationically polymerizable epoxy compound (hereinafter also referred to as simply the epoxy compound) in the invention is a compound having one or more oxirane rings in the molecule, and can be a monomer of a compound having an oxirane ring or an oligomer of a compound having an oxirane ring. Examples thereof include known aromatic epoxides, alicyclic epoxides, and aliphatic epoxides. The oligomer has preferably a lower molecular weight, and more preferably a molecular weight of less than 1000. In the invention, the epoxy compound has a solubility parameter (sp value) of from 10 to 20.

In the invention, the epoxy compound is preferably an epoxidized vegetable oil. Examples thereof include an epoxidized ester of fatty acid such as epoxy methyl stearate, epoxy butyl stearate, epoxy octyl stearate, or epoxidized glyceride; epoxidized soybean oil; epoxidized linseed oil; and epoxidized castor oil.

In the invention, the cationically polymerizable epoxy compound is contained in the actinic ray curable ink-jet ink in an amount of not less than 35% by weight, preferably more than 50% by weight, and more preferably not less than 65% by weight, based on the total weight of the cationically polymerizable compound in the actinic ray curable ink-jet ink. When the cationically polymerizable epoxy compound content is less than 35% by weight based on the total weight of the cationically polymerizable compound, it results in poor curability.

The oxetane ring-containing compound (hereinafter also referred to as oxetane compound) in the invention is a compound having one or more oxetane rings in the molecule, and a commonly known oxetane compound is used. The oxetane compound in the invention has an sp value of from 5 to 8.0. Preferred examples of the oxetane compound in the invention include 1,4-bis [(3-ethyl-3-oxetanyl)-methoxymethyl]benzene (OXT 121 etc.), 3-ethyl-3-(phenoxymethyl)oxetane (OXT 211 etc.), and di(1-ethyl-3-oxetanyl) methyl ether (OXT 221 etc.), each produced by To a Gosei Co., Ltd. These can be used singly or as a mixture of two or more thereof.

The sp value in the invention is determined according to an Okitsu method described below. An epoxy compound whose sp value, obtained by being measured according to the Okitsu method, falls within the range defined in the invention, is the epoxy compound in the invention. An oxetane ring-containing compound whose sp value, obtained by being measured according to the Okitsu method, falls within the range defined in the invention, is the oxetane ring-containing compound in the invention.

The Okitsu method is a method calculating employing Okitsu formula disclosed in Toshinao Okitsu, "Secchaku" Vol. 38, 6, 246–252 (1994).

The content of the cationically polymerizable epoxy compound in the actinic ray curable ink-jet ink of the invention is from 20 to 85 parts by weight, and preferably from 35 to 85 parts by weight. The content of the cationically polymerizable oxetane ring-containing compound in the actinic ray curable ink-jet ink of the invention is from 14 to 54 parts by weight, and preferably from 14 to 47 parts by weight.

Examples of the vinyl ether compound contained in the ink-jet ink of the invention include di- or tri-vinyl ether compounds such as ethylene glycol divinyl ether, diethylene glycol divinyl ether, triethylene glycol divinyl ether, propylene glycol divinyl ether, dipropylene glycol divinyl ether, butane diol divinyl ether, hexane diol divinyl ether, cyclohexane dimethanol divinyl ether, and trimethylol propane trivinyl ether; and mono vinyl ether compounds such as ethylene glycol monovinyl ether, triethylene glycol monovinyl ether, hydroxyethyl monovinyl ether, hydroxynonyl monovinyl ether, ethyl vinyl ether, n-butyl vinyl ether, iso-butyl vinyl ether, octadecyl vinyl ether, cyclohexyl vinyl ether, hydroxybutyl vinyl ether, 2-ethylhexyl vinyl ether, cyclohexane dimethanol monovinyl ether, n-propyl vinyl ether, isopropyl vinyl ether, isopropenyl ether-o-propylene carbonate, dodecyl vinyl ether, diethylene glycol monovinyl ether, and octadecyl vinyl ether.

In these vinyl ether compounds, when the hardenability, adhesion or surface hardness is considered, di- or tri-vinyl ether compounds are preferable, and particularly divinyl ether compounds are preferable. In the present invention, these vinyl ether compounds may be used alone or as an admixture of two or more kinds thereof.

In the invention, the vinyl ether compound is a compound which may be added to the ink-jet ink of the invention. However, addition of the vinyl ether compound to the ink can lower viscosity of the ink, and can increase the curing rate of the ink. The vinyl ether compound is added in an amount of from 0 to 40% by weight, and preferably from 0 to 20% by weight to a liquid composition comprised of an oxirane ring-containing compound and an oxetane ring-containing compound.

The total content of the cationically-polymerizable compound in the actinic ray curable ink-jet ink of the invention is from 55 to 99 parts by weight, and preferably from 70 to 95 parts by weight.

Examples of the cationic photopolymerization initiator used in the invention include arylsulfonium derivatives (for example, Silacure UVI-6990 or Silacure UVI-6974 produced by Union Carbide Co., Ltd., or Adekaoptomer SP-150, Adekaoptomer SP-152, Adekaoptomer SP-170, or Adekaoptomer SP-172 produced by Asahi Denka Kogyo Co., Ltd.); aryliodonium derivatives (for example, RP-2074 produced by Rodia Co., Ltd.); Arene-ion complexes (for example, Irgacure 261 produced by Ciba Geigy Co., Ltd.); diazonium salts; triazine type initiator; and other halogenides. The cationic photopolymerization initiator content is preferably from 0.2 to 20 parts by weight of 100 parts by weight of cationically polymerizable compound. The content less than 0.2 parts by weight of the cationic photopolymerization initiator provides a poor hardening property, and the content exceeding 20 parts by weight of the cationic photopolymerization initiator does not exhibit a further hardening property. These cationic photopolymerization initiators may be used singly or as a mixture of two or more kinds thereof.

Examples of a photopolymerization promoting agent include anthracene; and anthracene derivatives (for example, Adekaoptomer SP-100 produced by Asahi Denka Kogyo Co., Ltd.). These photopolymerization promoting agents may be used singly or as a mixture of two or more kinds thereof.

The radically polymerizable ethylenically unsaturated compound is not specifically limited, as long as it is a known compound. Examples thereof include (meth)acrylate compounds, unsaturated polyesters, acryl-urethane compounds, and polythiols. These may be used singly or in combination. Among these, a compound having at least one (meth)acryl group in the molecule is preferred. Examples thereof include a reaction product of an epoxy compound and (meth)acrylic acid, (meth)acrylic esters derived from alcohols and (meth) acrylic acid, urethane (meth)acrylate, polyester (meth)acrylate, and polyether (meth)acrylate.

In the invention, a radical photopolymerization initiator can be used. The radical photopolymerization initiator is not specifically limited, as long as it is a known compound. Examples thereof include benzil or its dialkylacetal derivatives, acetophenone compounds, benzoin or its alkylether derivatives, benzophenone compounds, and thioxanthones compounds.

Examples of the pigment dispersant include carboxylic acid esters containing a hydroxyl group, salts of long chain polyaminoamides with high molecular weight acid esters, high molecular weight polycarboxylic acid salts, salts of long chain polyaminoamides with polar acid esters, high molecular weight unsaturated acid esters, high molecular copolymers, modified polyurethanes, modified polyacrylates, polyether ester type anion based surfactants, a salt of a naphthalenesulfonic acid formalin condensation product, a salt of an aromatic sulfonic acid formalin condensation product, polyoxyethylene alkylphosphoric acid esters, polyoxyethylene nonyl phenyl ether, stearylamine acetate, and pigment derivatives.

Typical examples of the pigment dispersants include "Anti-Terra-U (a polyaminoamide phosphoric acid salt)", "Anti-Terra-203/204 (a high molecular weight polycarboxylic acid salt)", "Disperbyk-101 (polyaminoamide phosphoric acid salt and acid ester), 107 (a hydroxyl group containing carboxylic acid ester), 110 (an acid group containing copolymer), 130 (polyamide), 161, 162, 163, 164, 165, 166, and 170 (high molecular copolymer)", "400", "Bykumen" (a high molecular weight unsaturated acid ester), "BYK-P104, P105 (high molecular weight unsaturated polycarboxylic acid)" "P104S, 240S (high molecular weight unsaturated acid polycarboxylic acid and silicon based), and "Lactimon (long chain amine, unsaturated acid polycarboxylic acid, and silicon)", manufactured by BYK Chemie Co.

Further, listed are "Efka 44, 46, 47, 48, 49, 54, 63, 64, 65, 66, 71, 701, 764, and 766", "Efka Polymer 100 (modified polyacrylate), 150 (an aliphatic modified polymer), 400, 401, 402, 403, 450, 451, 452, and 453 (modified polyacrylates), 745 (being copper phthalocyanine based)", manufactured by Efka Chemicals Co., and "Flowlen TG-710 (urethane oligomer)", "Flownon SH-290, SP-1000", "Polyflow No. 50E, and No. 300 (an acryl based copolymer)", manufactured by Kyoei Kagaku Co., "Disparlon KS-860, 873SN, and 874 (a polymer dispersing agent), #2150 (aliphatic multivalent carboxylic acid), and #7004 (polyether ester type)", manufactured by Kusumoto Kasei Co.

Further, listed are "Demol RN and N (both are naphthelenesulfonic acid formalin condensation product sodium salts), MS, C, and SN-B (all are aromatic sulfonic acid formalin condensation product sodium salts), and EP", "Homogenol L-18 (a polycarboxylic acid type polymer)", "Emulgen 920, 930, 931, 935, 950, and 985 (all are polyoxyethylene nonyl phenyl ethers)", and "Acetamin 24 (coconut amine acetate) and 86 (stearylamine acetate)", manufactured by Kao Corp., "Solsperse 5000 (phthalocyanine ammonium salt based), 13240 and 13940 (both are polyesteramine based), 17000 (being fatty acid amine based), 24000, 28000, and 32000", manufactured by Zeneca Corp., "Nikkol T106 (polyoxyethylene sorbitan monooleate), MYS-IEX (polyoxyethylene monostearate), and Hexagline 4-0 (hexaglyceryl tetraoleate)", manufactured by Nikko Chemical Co., Ltd.

The pigment dispersant content of ink is preferably from 0.1 to 10% percent by weight.

The ink-jet ink of the invention can be prepared by dispersing pigment, an actinic ray curable compound and a pigment dispersant in a conventional disperser such as a sand mill. It is preferred that a solution containing a high concentration of pigment prepared in advance is diluted with an actinic ray curable compound. A conventional disperser can be used. Therefore, neither excessive dispersion energy nor much dispersion time is necessary, and ink with excellent stability is obtained without causing deterioration of the ink components. It is preferred that the dispersed ink composition is filtered with a filter with a pore diameter of not more than 3 µm, and then with a filter with a pore diameter of not more than 1 µm.

The ink-jet ink of the invention has a viscosity at 25° C. of preferably from 5 to 50 mPa·s. Ink having a viscosity at 25° C. of from 5 to 50 mPa·s is stably ejected not only from a recording head with a normal frequency of 4 to 10 KHz but also from a recording head with a high frequency of 10 to 50 KHz. Ink having a viscosity at 25° C. of less than 5 mPa·s lowers a following property of ink ejection from a recording head with a high frequency, and ink having a viscosity at 25° C. exceeding 50 mPa·s lowers ink ejection stability, resulting in incapability of ejection, even if a recording head is provided with a viscosity decreasing mechanism for lowering ink viscosity such as a heater.

It is preferred that the ink-jet ink of the invention used in a piezo type recording head be adjusted to an electroconductivity of not more than 10 µS/cm so that the inside of the head is not corroded by ink the composition. It is preferred that the electroconductivity of the ink composition used in a continuous type recording head be adjusted by an electrolyte to not less than 0.5 mS/cm.

As resins for a recording medium used in the invention, conventional synthetic resins widely used for various use can be used. Examples of the resins include polyester, polyethylene, polyurethane, polypropylene, acryl resin, polycarbonate, polystyrene, acrylonitrile-butadiene-styrene copolymer, polyethylene terephthalate, and polybutadiene terephthalate. Thickness or form of the recording medium comprised of these resins is not specifically limited.

Usage of the ink-jet ink of the invention is as follows: The ink-jet ink is incorporated in a recording head of an ink jet printer, ejected from the recording head onto a recording medium, and exposing the ejected ink on the recording medium to actinic rays such as ultraviolet light and an electron beam, whereby the ink on the recording medium is rapidly cured.

Examples of a light source for actinic ray include a mercury arc lamp, a xenon arc lamp, a fluorescent lamp, a carbon arc lamp, a tungsten-halogen lamp, and sunlight. When electron beam is used for actinic ray, the ink is ordinarily cured employing an electron beam having energy of not more than 300 eV, but can be instantly cured instantly by irradiation of 1 to 5 Mrad.

EXAMPLES

The invention will now be explained employing examples, however, the embodiments of the invention are not limited thereto.

<<Preparation of Inventive Ink Samples 1 Through 8>>

A mixture of pigment, a pigment dispersant, an epoxy compound, an oxetane compound, and optionally a vinyl ether-compound as shown in Table 1 was dispersed in a sand mill for 4 hours to obtain an actinic ray curable ink liquid. Thereafter, the resulting ink liquid was mildly mixed with the initiator as shown in Table 1, and filtered under pressure employing a membrane filter to obtain an actinic ray curable ink-jet ink. Thus, inventive ink samples 1 through 8 were obtained.

[Preparation of Printed Matter]

Each of the inventive ink samples obtained above was ejected onto a polyethylene terephthalate recording sheet employing an ink jet printer with a piezo type recording head, and then the ink on the recording sheet was cured employing a UV light source (with 8 cold-cathode tubes: 20 W output power), while the recording sheet was transported at a rate of from 200 to 1000 mm/second. Thus, printed matter was obtained.

Details of the components described in Table 1 are as follows:

Pigment

P1: Crude copper phthalocyanine ("Copper phthalocyanine" produced by Toyo Ink Manufacturing Co., Ltd.) of 250 parts, 2500 parts of sodium chloride, and 160 parts of polyethylene glycol (Polyethylene glycol 300 produced by Tokyo Kasei Co., Ltd.) were placed in a 4.55 liter (1 gallon) polystyrene kneader (produced by Inoue Seisakusho o., Ltd.) and kneaded for 3 hours. The resulting mixture was poured into a 2.5 liter hot water, and stirred in a high speed mixer at about 80° C. for about one hour to obtain a slurry. The resulting slurry was filtered off, washed with water 5 times to eliminate the sodium chloride and the solvent, and dried employing a spray drying method. Thus, Pigment P1 was obtained.

Epoxy Compounds

E1: Celoxide 2021P: (Alicyclic epoxide produced by Daiseru Kagaku Co., Ltd.)

E2: Celoxide 3000: (Alicyclic epoxide produced by Daiseru Kagaku Co., Ltd.)

E3: Vikoflex 9010 (Epoxidized vegetable oil ester produced by ATOFINA Co., Ltd.)

E4: Vikoflex 9040 (Epoxidized vegetable oil ester produced by ATOFINA Co., Ltd.)

Oxetane Compounds

OXT221: Oxetane compound (produced by To a Gosei Co., Ltd.)

OXT121: Oxetane compound (produced by To a Gosei Co., Ltd.)

OXT211: Oxetane compound (produced by To a Gosei Co., Ltd.)

OXT212: Oxetane compound (produced by To a Gosei Co., Ltd.)

OXT101: Oxetane compound (produced by To a Gosei Co., Ltd.)

Vinyl Ether Compound

DVE-3: Triethylene glycol divinyl ether (produced by ISP Co., Ltd.)

Pigment Dispersant

32000: Aliphatic group modified compound ("Solsperse 32000"(produced by Zeneca Co., Ltd.)

Initiator

SP-152: Triphenyl sulfonium salt ("Adekaoptomer SP-152" produced by Asahi Denka)

The solubility parameter (sp value) of the compounds used is shown in Table 2.

TABLE 1

| | | Inventive ink sample No. | | | | | | | |
|---|---|---|---|---|---|---|---|---|---|
| | | 1 | 2 | 3 | 4 | 5 | 6 | 7 | 8 |
| Pigment | P1 (weight parts) | 5 | 5 | 5 | 5 | 5 | 5 | 5 | 5 |
| Epoxy compound | E1 (weight parts) | 50 | | | | 50 | | | |
| | E2 (weight parts) | | 65 | | | | 65 | | |
| | E3 (weight parts) | | | 60 | | | | 60 | |
| | E4 (weight parts) | | | | 65 | | | | 65 |
| Oxetane compound | OXT221 (weight parts) | 37 | | 27 | | 30 | | 27 | |
| | OXT121 (weight parts) | | 22 | | 17 | | 17 | | 17 |
| | OXT211 (weight parts) | | | 10 | | | | | |
| | OXT212 (weight parts) | | | | 5 | | | | |
| Vinyl ether compound | DVE-3 (weight parts) | | | | | 7 | 5 | 10 | 5 |
| Pigment dispersant | 32000 (weight parts) | 3 | 3 | 3 | 3 | 3 | 3 | 3 | 3 |
| Initiator | SP-152 (weight parts) | 5 | 5 | 5 | 5 | 5 | 5 | 5 | 5 |

TABLE 2

| | (sp value) |
|---|---|
| | Okitsu method |
| E1 | 13.60 |
| E2 | 7.10 |
| E3 | 10.81 |
| E4 | 10.35 |
| OXT221 | 6.57 |
| OXT121 | 7.70 |
| OXT211 | 7.80 |
| OXT212 | 7.28 |
| OXT101 | 8.84 |

[Preparation of Comparative Ink Samples 1 and 2]

Comparative ink samples 1 and 2 were prepared in the same manner as above, except that the components as shown in Table 3 below were used.

TABLE 3

|  |  | Comparative ink sample No. | |
|---|---|---|---|
|  |  | 1 | 2 |
| Pigment | P1 (weight parts) | 5 | 5 |
| Epoxy compound | E1 (weight parts) |  | 50 |
|  | E2 (weight parts) | 30 |  |
| Oxetane compound | OXT121 (weight parts) | 57 |  |
|  | OXT101 (weight parts) |  | 27 |
| Vinyl ether compound | DVE-3 (weight parts) |  | 10 |
| Pigment dispersant | 32000 (weight parts) | 3 | 3 |
| Initiator | SP-152 (weight parts) | 3 | 3 |

[Preparation of Printed Matter]

Printed matter was obtained in the same manner as above, except that comparative ink sample 1 or 2 was used.

With respect to inventive ink samples 1 through 8 and comparative ink samples 1 and 2 obtained above, and printed matter obtained employing them, the following evaluations were carried out. The results are shown in Table 4.

The evaluations were carried out as follows.

Curability

Curability was represented by the transporting rate (mm/second) in the used UV light source of the recording sheet at which tackiness of the printed ink is not perceived by fingering. The higher transporting rate reduces irradiation energy necessary to cure, and provides better curability.

Ejection Stability

After 30 minutes' continuous ink ejection was carried out, clogging of nozzles from which ink was ejected was observed and evaluated according to the following criteria:

A: After 30 minutes' continuous ink ejection, no clogging of nozzles was observed B: After 30 minutes' continuous ink ejection, no clogging of nozzles was observed, but satellite occurred.

C: After 30 minutes' continuous ink ejection, clogging of nozzles was observed.

Strength of Ink Layer

Scratch test was carried out, in which the ink layer formed was scratched with a fingernail, and the strength of ink layer was evaluated according to the following criteria:

A: No ink layer was peeled off by scratch.

B: A part of the ink layer was peeled off by strong scratch.

C: The ink layer was easily peeled off by scratch.

Adhesion Property

A cross-cut adhesion test was carried out according to a method as described in JIS K5400. Eleven cut lines at an interval of 1 mm were formed in the transverse and longitudinal directions on images of the printed matter obtained above to form one hundred grids. Then, a cellophane tape (R) was adhered to the formed grids and sharply peeled off perpendicularly (cross-cut adhesion test).

Similarly, a cellophane tape (R) was adhered to images of the printed matter without cut lines, and sharply peeled off perpendicularly (simple adhesion test).

Evaluation was carried out according to the following criteria:

A: No peeled images were observed at the cross-cut adhesion test.

B: Some peeled images were observed at the cross-cut adhesion test, but no peeled images without cut lines were observed at the simple adhesion test.

C: Peeled images were observed at both adhesion tests above.

Solvent Resistance and Water Resistance

Printed matter obtained employing each of the ink samples was immersed in 50° C. alcohol or in 50° C. water for 10 seconds, breakage and shrinkage of the printed image were observed and evaluated according to the following criteria:

A: No change was observed.

B: A slight breakage and shrinkage was observed.

C: Apparent breakage and shrinkage was observed.

TABLE 4

| Ink sample No. | Curability (mm/seconds) | Ejection stability | Strength of ink layer | Adhesion property | Solvent resistance | Water resistance |
|---|---|---|---|---|---|---|
| 1 (Inv.) | 500 | A | A | A | A | A |
| 2 (Inv.) | 400 | A | A | A | A | A |
| 3 (Inv.) | 400 | A | A | A | A | A |
| 4 (Inv.) | 500 | A | A | A | A | A |
| 5 (Inv.) | 500 | A | A | A | A | A |
| 6 (Inv.) | 500 | A | A | A | A | A |
| 7 (Inv.) | 500 | A | A | A | A | A |
| 8 (Inv.) | 500 | A | A | A | A | A |
| 1 (Comp.) | 800 | C | C | B | C | B |
| 2 (Comp.) | 1000 | C | C | C | C | C |

Inv.: Invention,
Comp.: Comparative

As is apparent from Table 4, the inventive ink samples provide good curability, high strength of a cured ink layer, excellent stability of ejection from nozzles, good adhesion to a recording sheet, good solvent resistance and good water resistance, as compared with the comparative ink samples.

EFFECTS OF THE INVENTION

The present invention can provide an actinic ray curable ink-jet ink providing excellent photopolymerization properties, good curability, high strength of a cured ink layer, excellent stability of ejection from nozzles, good adhesion to a substrate, good solvent resistance, and good water resistance, and provide a printed matter prepared employing the actinic ray curable ink-jet ink.

What is claimed is:

1. An actinic ray curable ink-jet ink comprising a cationically polymerizable compound including a cationically polymerizable epoxy compound and a cationically polymerizable oxetane ring-containing compound, wherein the actinic ray curable ink-jet ink contains the cationically polymerizable epoxy compound in an amount of from 50 to 95% by weight based on the total amount of cationically polymerizable compound, the catatonically polymerizable epoxy compound having a solubility parameter (sp value) of from 10 to 20, and the cationically polymerizable oxetane ring-containing compound having a solubility parameter (sp value) of from 5 to 8.0, and wherein the actinic ray curable ink-jet ink has a viscosity at 25° C. of 5 to 50mPa·s.

2. The actinic ray curable ink-jet ink of claim 1, wherein the actinic ray curable ink-jet ink contains the cationically polymerizable epoxy compound in an amount of from 65 to 95% by weight based on the total amount of cationically polymerizable compound.

3. The actinic ray curable ink-jet ink of claim 1, wherein the epoxy compound is epoxidized vegetable oil.

4. The actinic ray curable ink-jet ink of claim 1, further comprising a vinyl ether compound.

5. The actinic ray curable ink-jet ink of claim 1, further comprising a cationic photopolymerization initiator as an initiator.

6. The actinic ray curable ink-jet ink of claim 1, further comprising a radically polymerizable ethylenically unsaturated compound.

7. The actinic ray curable ink-jet ink of claim 1, further comprising pigment as a colorant.

8. The actinic ray curable ink-jet ink of claim 7, further comprising a pigment dispersant.

9. The actinic ray curable ink-jet ink of claim 8, wherein the pigment has an average particle size of from 10 to 150 nm.

10. A printed matter, prepared by supplying the actinic ray curable ink-jet ink of claim 1 onto a recording medium.

* * * * *